(12) United States Patent
Kobayashi et al.

(10) Patent No.: US 9,070,550 B2
(45) Date of Patent: Jun. 30, 2015

(54) SEMICONDUCTOR DEVICE AND MANUFACTURING METHOD THEREOF

(75) Inventors: Daisaku Kobayashi, Kanagawa (JP); Takayoshi Fujishiro, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 1229 days.

(21) Appl. No.: 11/840,966

(22) Filed: Aug. 18, 2007

(65) Prior Publication Data

US 2008/0128830 A1 Jun. 5, 2008

(30) Foreign Application Priority Data

Aug. 30, 2006 (JP) .................................. 2006-233368

(51) Int. Cl.
*H01L 27/088* (2006.01)
*H01L 21/8234* (2006.01)
*H01L 27/02* (2006.01)
*H01L 23/00* (2006.01)
*H01L 23/528* (2006.01)
*H01L 29/78* (2006.01)

(52) U.S. Cl.
CPC ......... *H01L 27/0207* (2013.01); *H01L 23/5286* (2013.01); *H01L 24/05* (2013.01); *H01L 24/06* (2013.01); *H01L 29/78* (2013.01); *H01L 2224/05093* (2013.01); *H01L 2924/01003* (2013.01); *H01L 2924/01004* (2013.01); *H01L 2924/01013* (2013.01); *H01L 2924/01014* (2013.01); *H01L 2924/01033* (2013.01); *H01L 2924/01052* (2013.01); *H01L 2924/14* (2013.01); *H01L 2924/19043* (2013.01); *H01L 2924/01005* (2013.01); *H01L 2924/01006* (2013.01); *H01L 2924/13091* (2013.01); *H01L 2224/02166* (2013.01)

(58) Field of Classification Search
USPC ............ 257/401, E27.06, E21.616, 202–211, 257/288, 368, 758; 438/197
See application file for complete search history.

(56) References Cited

U.S. PATENT DOCUMENTS

| | | |
|---|---|---|
| 5,581,109 A | 12/1996 | Hayashi et al. |
| 6,900,482 B2 | 5/2005 | Aoki et al. |
| 2002/0140024 A1 | 10/2002 | Aoki et al. |
| 2005/0077550 A1* | 4/2005 | Inaba et al. .................. 257/250 |
| 2005/0181582 A1* | 8/2005 | You .............................. 438/479 |
| 2007/0120258 A1* | 5/2007 | Hayashi et al. ............... 257/758 |

FOREIGN PATENT DOCUMENTS

| | | |
|---|---|---|
| JP | 2002299351 A | 10/2002 |
| JP | 2005252275 A | 9/2005 |

* cited by examiner

*Primary Examiner* — Lynne Gurley
*Assistant Examiner* — Vernon P Webb
(74) *Attorney, Agent, or Firm* — Sughrue Mion, PLLC

(57) ABSTRACT

A semiconductor device includes a transistor formed by dividing into a first and a second areas, a source electrode pad connected with a first source region formed in the first area and a second source region formed in the second area, a drain electrode pad connected with a first drain region formed in the first area and a second drain region formed in the second area and a connection line to connect a first gate line and a second gate line, where the connection line being provided in a same layer as the first gate line formed in the first area and the second gate line formed in the second area. A wiring for connecting between nodes of another circuit can be provided over the layer having the connection line provided therein and thus the size of a circuit chip can be reduced.

9 Claims, 16 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

2. Description of Related Art

In recent years, an integration of a circuit chip including LSI (Large System Integration) is rapidly developing. Along with this, an I/O (Input/Output) circuit itself composed of a power transistor or the like that is mounted to a circuit chip is strongly demanded to reduce its size.

In U.S. Pat. No. 5,581,109, a technique for reducing the size of an I/O circuit having a plurality of pads and transistor array areas or the like is disclosed.

FIG. 16 shows a conventional I/O circuit 100. As shown in FIG. 16, the I/O circuit 100 includes connection lines 101, first AREA102, second AREA103, source electrode pads 104 and drain electrode pads 105.

The I/O circuit 100 is a transistor divided into the first AREA102 and second AREA103. In each of the first AREA102 and second AREA103, drain regions (not shown) and source regions (not shown) are formed with gate lines (not shown) provided. The drain regions formed in the first AREA102 are connected with the drain regions formed in the second AREA103. The source regions formed in the first AREA102 are connected with the source regions formed in the second AREA103. Furthermore, the gate lines formed in the first AREA102 are connected with the gate lines formed in the second AREA103 via the connection lines 101.

Conventionally, the connection line 101 has been provided in a wiring layer located in an upper layer of a gate wiring layer. That is, after placing the gate line and depositing an insulating layer over the gate line, the connection line 101 has been provided over the insulating layer.

However, it has now discovered that placing the connection lines 101 as described above makes it harder to reduce the size of the circuit chip. More specifically, a line provided in the same layer with the connection line 101 can not be used for connecting a node N1 and a node N2 as shown in FIG. 16. Therefore, a line provided in a different layer from the layer including the connection line 101 is used to connect the nodes N1 and N2 when the area below the pads 104 and 105 is required to be used, and thereby causing to increase the number of wiring layers of the I/O circuit 100.

Furthermore, to connect the nodes N1 and N2 by the line provided in the same layer with the layer having the connection line 101, the line must be provided bypassing the I/O circuit 100.

SUMMARY

In one embodiment, a semiconductor device includes a transistor divided into a first and a second areas; a source electrode pad connected with a first source region former in the first area and a second source region formed in the second area; a drain electrode pad connected with a first drain region formed in the first area and a second drain region formed in the second area; and a connection line provided in a same layer as a first gate line formed in the first area and a second gate line formed in the second area.

In another embodiment, a semiconductor device includes a transistor divided into a first and a second areas; a source electrode pad connected with a first source region formed in the first area and a second source region formed in the second area; a drain electrode pad connected with a first drain region formed in the first area and a second drain region formed in the second area; and means for connecting a first gate line and a second gate line, the means being provided in a same layer as the first gate line formed in the first area and the second gate line formed in the second area.

In another embodiments, a method of manufacturing a semiconductor device includes forming a first source region and a first drain region in a first area of a principle surface of a semiconductor substrate; forming a second source region and a second drain region in a second area of the principle surface of the semiconductor substrate; forming a first gate line in the first area at a gate wiring layer over the principle surface of the semiconductor substrate; forming a second gate line in the second area at the gate wiring layer; and forming a connection line in a middle area at the gate wiring layer, the middle area is an area between the first area and the second area.

The connection line is provided in the same layer with the first gate line formed in the first area and the second gate line formed in the second area. Therefore, a layer of free wiring space can be obtained over the layer where the connection line is provided. Thus wirings for connecting between nodes of other circuits can be provided in this free wiring space. Consequently the size of the circuit chip can be reduced sufficiently.

BRIEF DESCRIPTION OF THE DRAWING

The above and other objects, advantages and features of the present invention will be more apparent from the following description of certain preferred embodiments taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
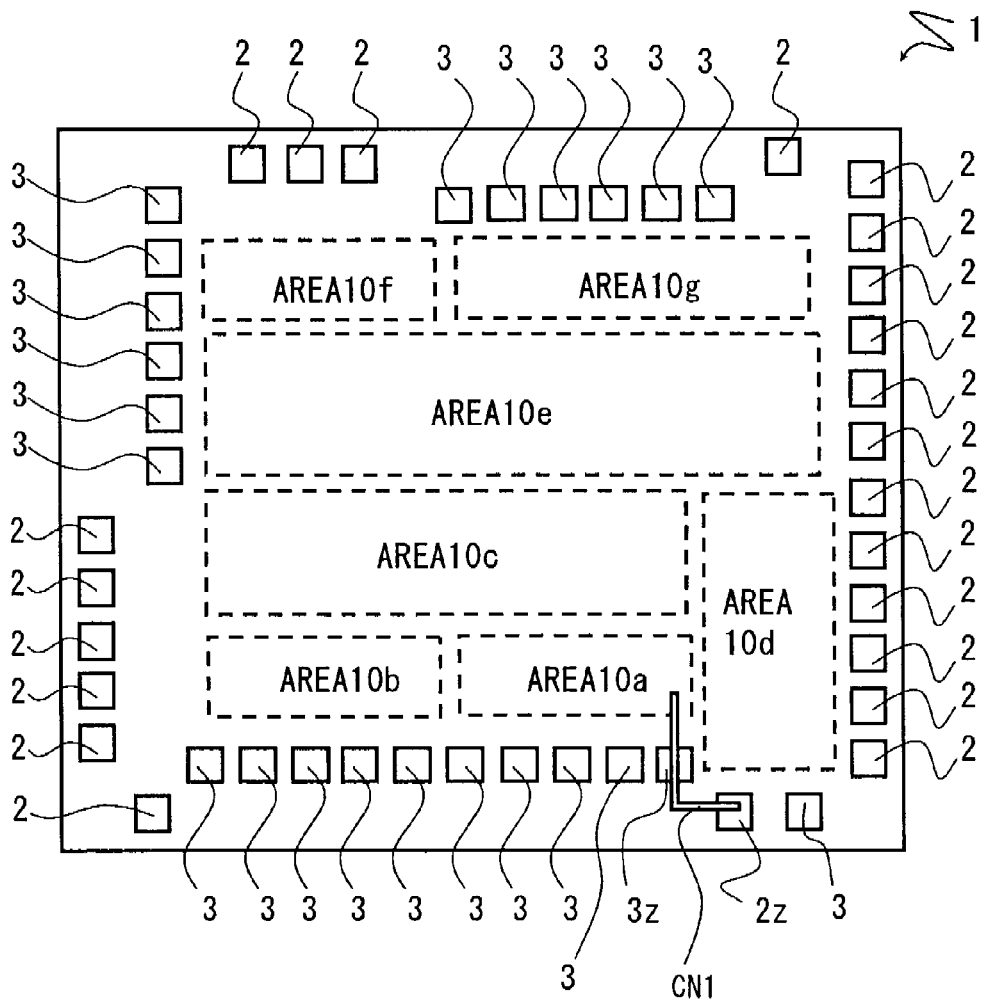
FIG. 1 is a schematic configuration diagram of a circuit chip 1.

FIG. 1 is a schematic configuration diagram of a circuit chip 1. The circuit chip 1 includes a plurality of I/O circuits for inputting or outputting signal 2 and a plurality of I/O circuits for power supply 3. It further includes a plurality of functional areas AREA10a to 10g.

The I/O circuit 2 is connected with at least one of the functional areas AREA10a to 10g. The I/O circuit 3 is connected with at least one of the functional areas AREA10a to 10g.

As shown in FIG. 1, it is difficult to connect the functional area AREA10a with an I/O circuit 2z, because there is provided the functional area AREA10d. In this embodiment, as made apparent from the later explanation, by using the I/O circuit 3z, the node in the functional area AREA10a and the node in the I/O circuit 2z can be connected by a line CN1 as shown in FIG. 1. Note that the line CN1 is provided in a first wiring layer (described later in detail) of the I/O circuit 3z. The line CN1 is electrically separated from the I/O circuit 3z for power supply.

Figure 2:
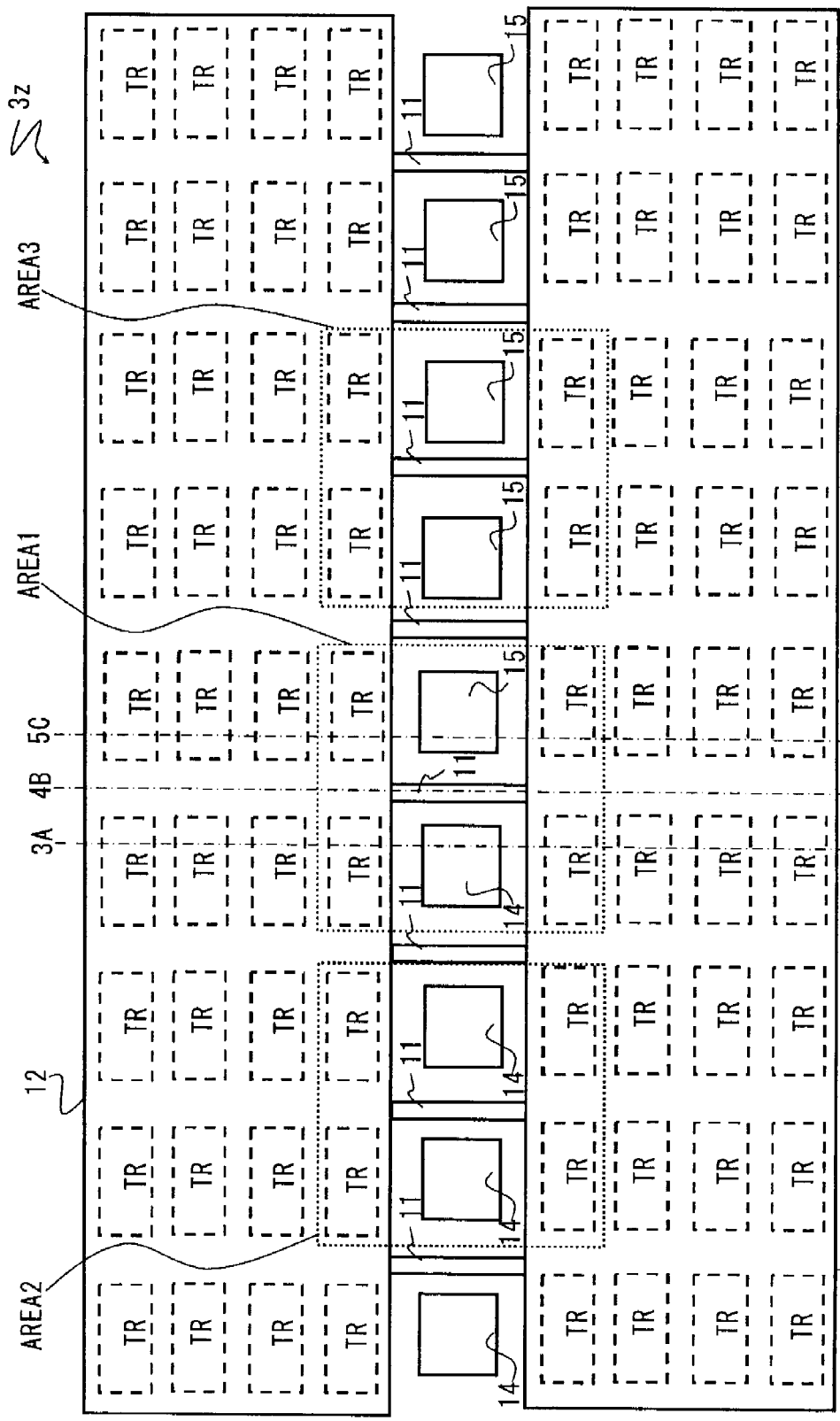
FIG. 2 is a schematic configuration diagram of an I/O circuit 3z.
Figure 3:
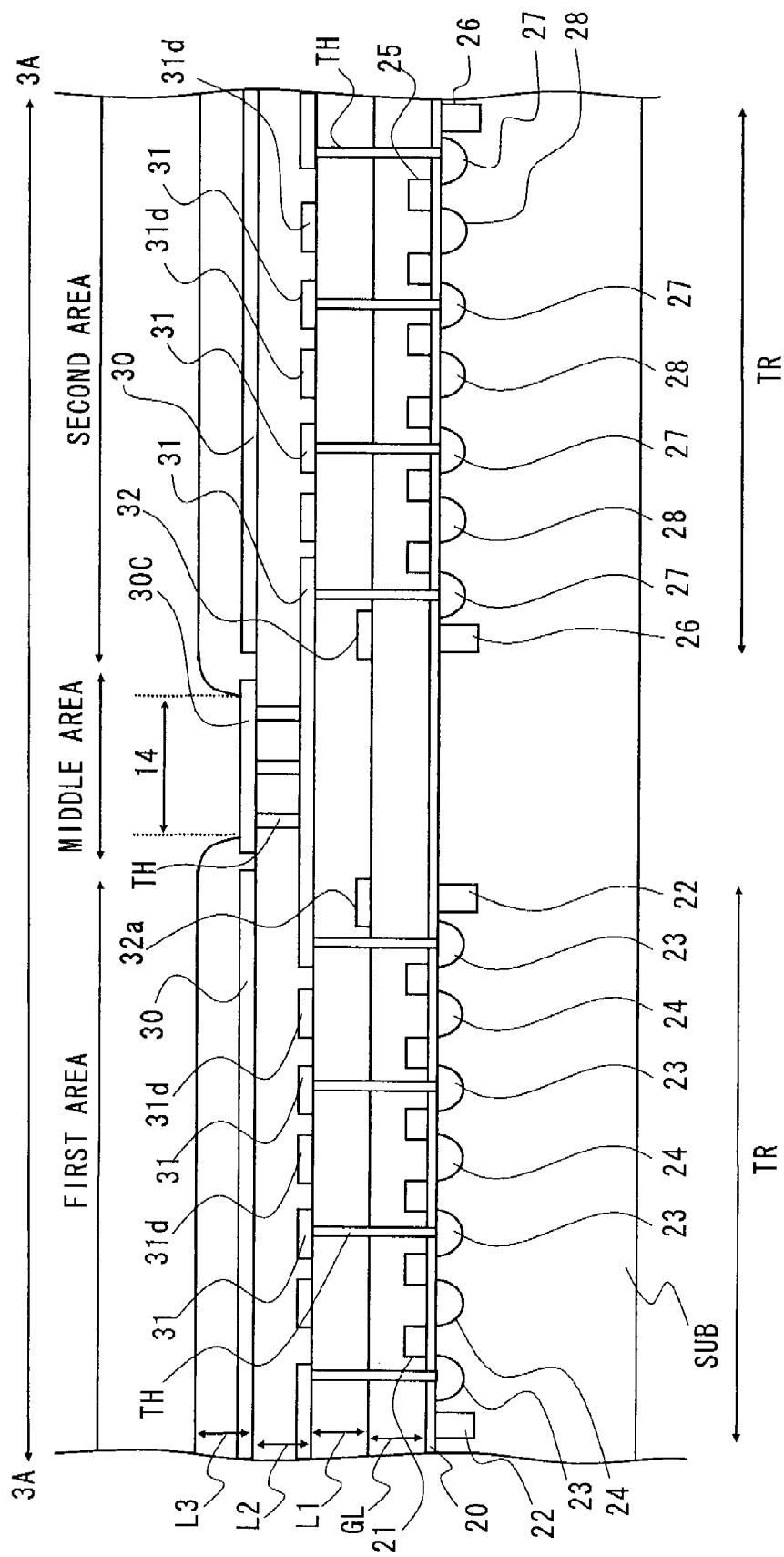
FIG. 3 is a schematic partial cross-sectional diagram of the I/O circuit 3z taken along the line 3A-3A of FIG. 2.
Figure 4:
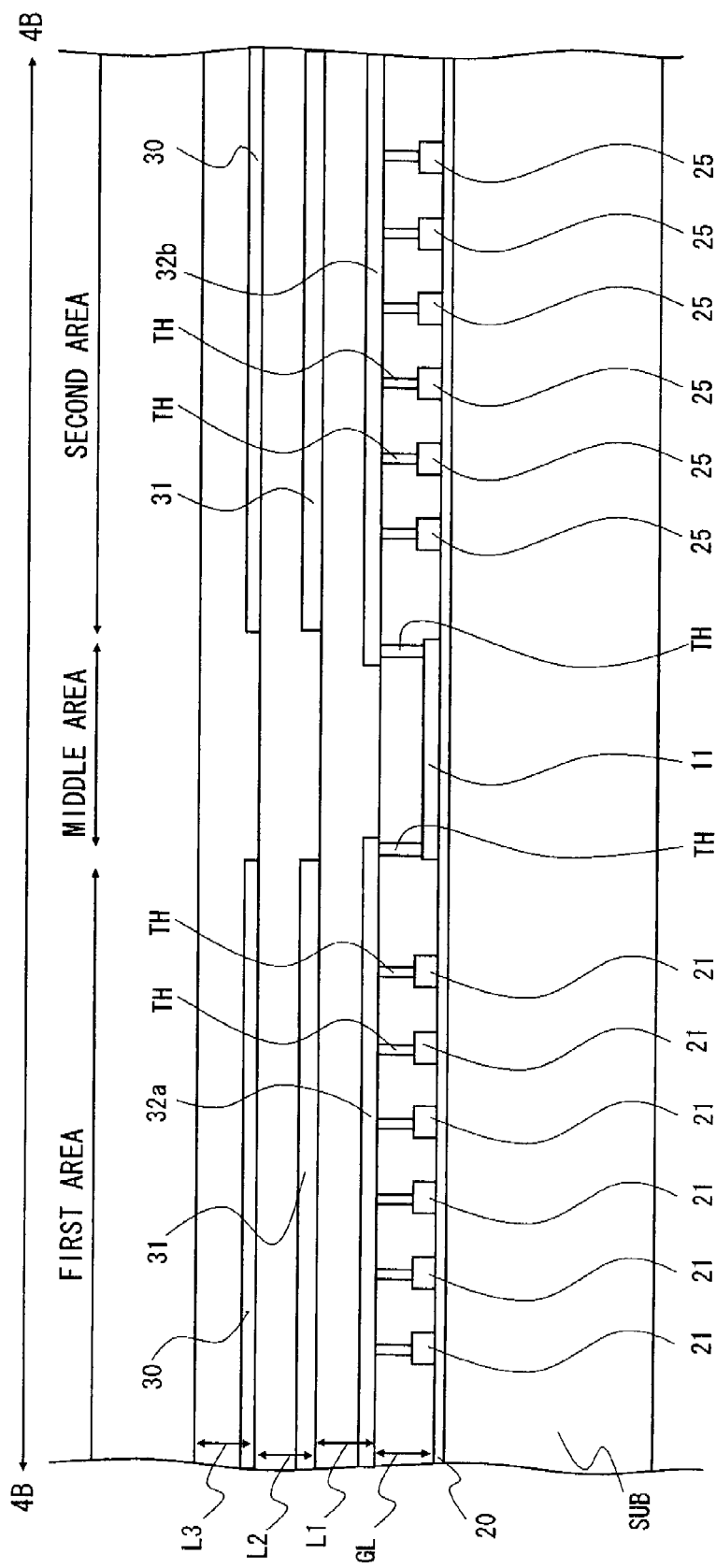
FIG. 4 is a schematic partial cross-sectional diagram of the I/O circuit 3z taken along the line 4B-4B of FIG. 2.
Figure 5:
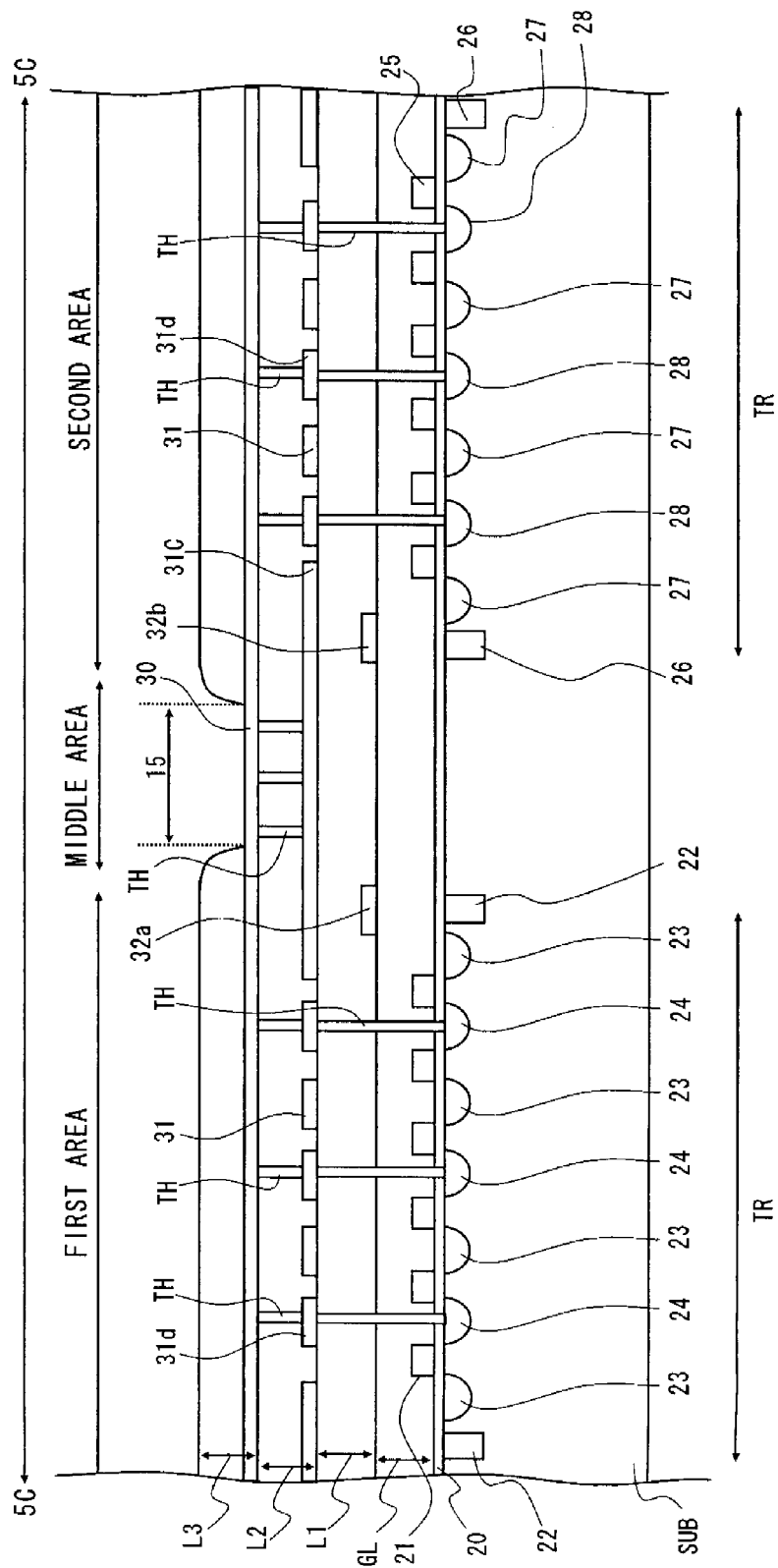
FIG. 5 is a schematic partial cross-sectional diagram of the I/O circuit 3z taken along the line 5C-5C FIG. 2.

FIG. 2 is a schematic configuration diagram of the I/O circuit 3z. Furthermore, FIG. 3 is a partial cross-sectional diagram of the I/O circuit 3z taken along the line 3A-3A of FIG. 2. FIG. 4 is a partial cross-sectional diagram of the I/O circuit 3z taken along the line 4B-4B of FIG. 2. FIG. 5 is a partial cross-sectional diagram of the I/O circuit 3z taken along the line 5C-5C of FIG. 2. Note that FIGS. 3 to 5 are partial cross-sectional diagrams in a range of a specific area AREA1 of FIG. 2.

As shown in FIG. 2, the I/O circuit 3z includes connection lines 11, a first area 12, second area 13, source electrode pads 14 and drain electrode pads 15.

The I/O circuit 3z is a MOS (Metal Oxide Semiconductor) transistor divided into the first area 12 and second area 13. In a middle area between the first area 12 and the second area 13, the source electrode pads 14 and drain electrode pads 15 are formed. That is, the I/O circuit 3z is divided into the first area 12 and second area 13 with the source electrode pads 14 and drain electrodes pads 15 interposed therebetween. Moreover, in the middle area between the first area 12 and second area 13, the connection lines 11 are provided.

As shown in FIG. 2, there are 4 source electrode pads 14 and 5 drain electrode pads 15. That is, number of the drain electrode pads 15 are larger than number of the source electrode pads 14. Therefore, a current can be put into the I/O circuit 3z sufficiently.

Furthermore, the connection lines 11 are provided between the source electrode pads 14 and drain electrode pads 15 as shown in FIG. 2. The connection lines 11 are formed between the source electrode pads 14. Likewise, the connection lines 11 are formed between the source electrode pads 15.

More specifically, the source electrode pads 14 and drain electrode pads 15 are not formed to overlap the connection lines 11. In other words, the source electrode pads 14 and drain electrode pads 15 are not formed immediately above the connection lines 11. By this, it is possible to suppress the connection lines 11 from deteriorating by physical stress generated when bonding wires to the source electrode pads 14 and drain electrode pads 15.

Furthermore as shown in FIG. 2, in each of the first area 12 and second area 13, a plurality of unit transistors TR are formed. As shown in FIG. 2, in each of the first area 12 and second area 13, the unit transistors TR are arranged two dimensionally. That is, the unit transistors TR are arranged along the array direction of the electrode pads (source electrode pads 14 and drain electrode pads 15) that are formed in the middle area. Furthermore, the unit transistors TE are arranged along the direction orthogonal to the array direction of the electrode pads (source electrode pads 14 and drain electrode pads 15) that are formed in the middle area.

As for the unit transistors TR formed in the first area 12, same elements are connected with each other (see FIG. 3 for the code). That is, a source region 23 of the unit transistor TR formed in the first area 12 is connected with a source region 23 of another unit transistor TR formed in the first area 12. A drain region 24 of the unit transistor TR formed in the first area 12 is connected with a source region 24 of another unit transistor TR formed in the first area 12. A gate line 21 of the unit transistor TR formed in the first area 12 is connected with a gate line 21 of another unit transistor TR formed in the first area 12.

Same elements are connected with each other (see FIG. 3 for the code) in the unit transistors TR formed in the second area 13, as same as the unit transistors TR formed in the first area 12. Note that a source region 27 corresponds to the source region 23, drain region 28 corresponds to the drain region 24 and gate line 25 corresponds to gate line 21. Accordingly, repeating explanations will be omitted.

As described above, the I/O circuit 3z is a MOS transistor formed by dividing into the first area 12 and second area 13. Therefore, as described later in detail, same elements are connected with each other in the MOS transistors formed in the first area 12 and second area 13.

Cross-sectional configuration of the I/O circuit 3z is described hereinafter in detail with reference to FIGS. 3 to 5. Furthermore, the connection relationship between the transistors in the first area 12 and second area 13 is described hereinafter in detail. In addition, the planar configuration of the I/O circuit 3z is described with reference to FIGS. 6 to 10 and 13.

Note that FIGS. 3 to 5 are partial cross-sectional diagrams in a range of the specific area AREA1 of FIG. 2. FIGS. 6 to 8, 10 and 13 are partial plan views in a range of a specific area AREA1 of FIG. 2. The omitted configuration of the unit transistor TR is same as the configuration of the illustrated unit transistor TR.

As shown in FIG. 3, the I/O circuit 3z includes a semiconductor substrate SUB made of a silicon material. Note that the semiconductor substrate SUB is made of a silicon substrate of a first conductive type (P type). An insulating layer 20 made of SiO2 or the like is formed on a principal surface of the semiconductor substrate SUB (the surface where wiring layers L1 to L3 are formed). Furthermore, over the insulating layer 20, a gate wiring layer GL, the first wiring layer L1, second wiring layer L2 and third wiring layer L3 are laminated in this order. Note that each of the wiring layers is covered by an insulating layer made of an insulating material (SiO$_2$ etc).

As shown in FIG. 3, the plurality of unit transistors TR are formed in each of the first area 12 and second area 13 and are formed on the principal surface of the semiconductor substrate SUB. For the sake of convenience, the unit transistors formed in the first area 12 may be referred to as first unit transistors and the unit transistors formed in the second area 13 may be referred to as second unit transistors.

Figure 6:
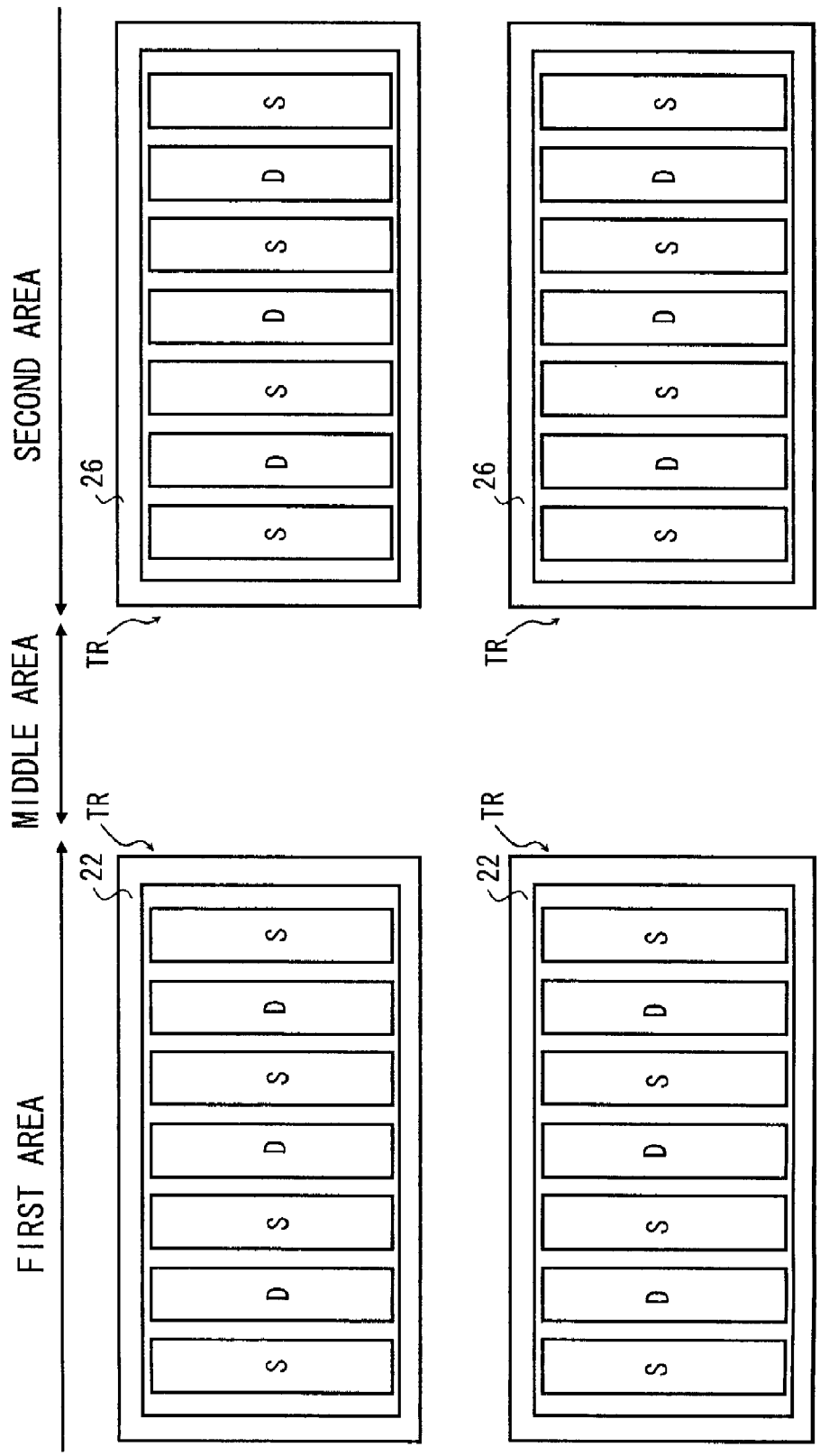
FIG. 6 is a schematic view explaining the planar configuration of source regions 23 (27) and drain regions (28) formed on a principal surface of a semiconductor substrate.

As shown in FIGS. 3 and 6, P type contact areas 22 (26) define the unit transistor TR. Inside the area surrounded by the contact areas 22 (26), a plurality of source regions 23 (27) and drain regions 24 (28) are formed. The source regions 23 (27) and drain regions 24 (28) are areas of a second conductivity type (N type) and formed alternatively at regular intervals.

The contact areas 22 (26) are set to a substrate potential. This enables a threshold voltage for forming a current path (channel) extended between the source regions 23 (27) and drain regions 24 (28) not to fluctuate among each of the unit transistor TR.

Figure 7:
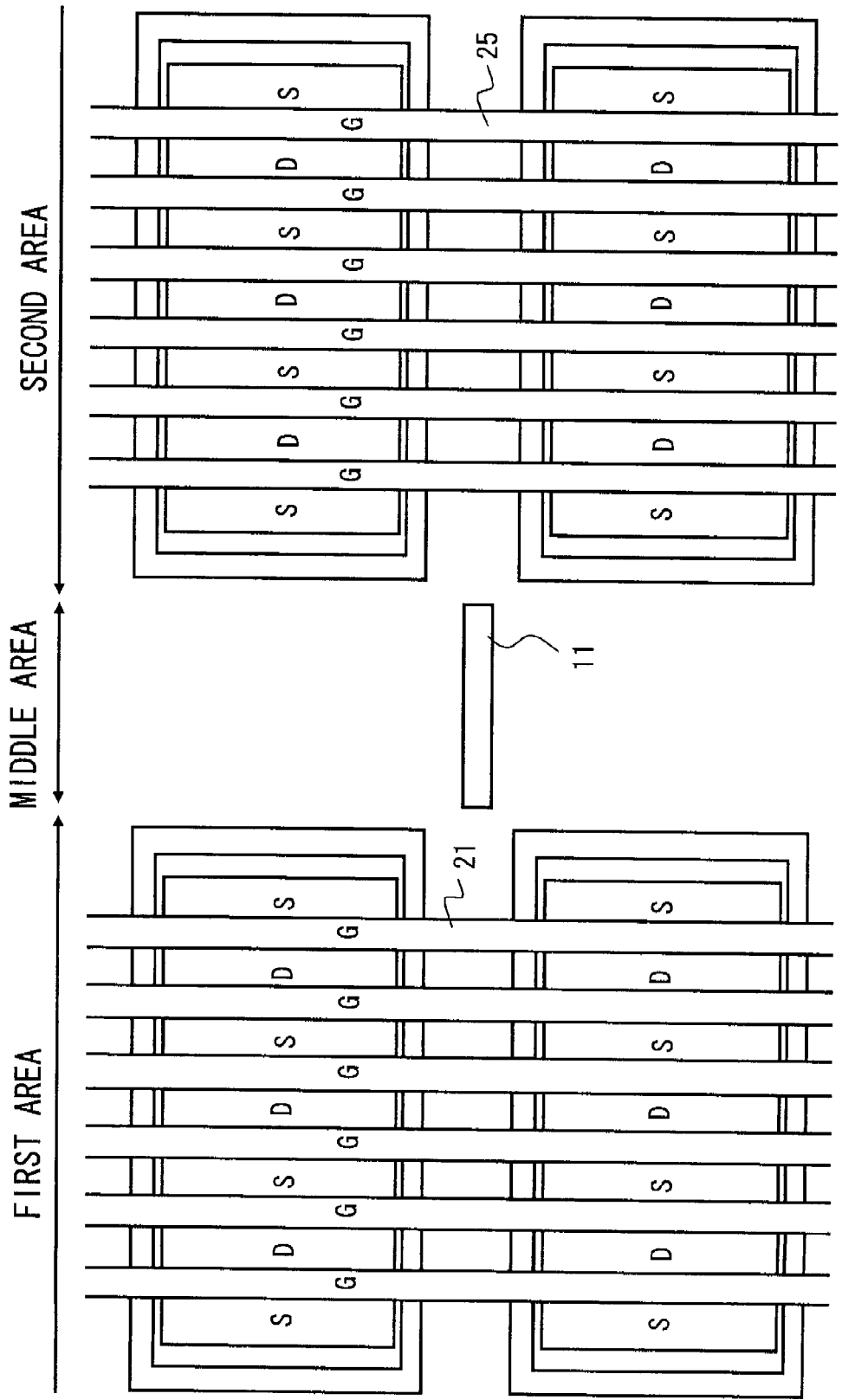
FIG. 7 is a schematic view explaining the planar configuration of the gate lines 21 (25) and connection line 11.

As shown in FIGS. 3 and 7, a plurality of gate lines 21 (25) are provided in each of the first area 12 and second area 13. And the plurality of gate lines 21 (25) are provided on the principal surface of the semiconductor substrate SUB. The gate lines 21 (25) are provided on an area between the source regions 23 (27) and drain regions 24 (28). Moreover, as shown in FIG. 3, the gate lines 21 (25) are provided immediately above the insulating layer 20 that is formed over the principal surface of the semiconductor substrate SUB.

Note that as shown in FIG. 7, in each of the first area 12 and second area 13, the plurality of gate lines 21 (25) are extended in parallel to each other along the array direction (see FIG. 2) of the electrode pads (source electrode pad 14 and drain electrode pad 15) that are formed in the middle area.

The gate lines 21 extended in the first area 12 are used in common among the unit transistors TR that are arranged along the extending direction of the gate lines 21. Furthermore, the gate lines 25 extended in the second area 13 are used in common among the unit transistors TR that are arranged along the extending Direction of the gate lines 25. By applying a voltage to the gate lines 21 (25), a current path (channel) is formed between the source region 23 (27) and drain region 24 (28).

As shown in FIG. 3, the source regions 23 (first source region) formed in the first area 12 and source regions 27 (second source region) are connected with the common source electrode pad 14.

That is, as shown in FIG. 3, the source regions 23 formed in the first area 12 are connected with source connection lines 31 provided in the second wiring layer L2 via through-holes TH that are filled with a conductive material. The source connection line 31 is connected with a source contact line 30C provided in the third wiring layer L3 via the through-holes TH that are filled with a conductive material. The source electrode pad 14 is formed by exposing a part of the source contact line 30C. With this configuration, the source regions 23 formed in the first area 12 are connected with the source electrode pad 14.

Moreover, as shown in FIG. 3, the source regions 27 formed in the second area 13 are connected with the source connection lines 31 provided in the second wiring layer L2 via the through-holes TH that are filled with a conductive material. As described above, the source connection line 31 is connected with source contact line 30C provided in the third wiring layer L3 via the through-holes TH that are filled with a conductive material. The source electrode pad 14 is formed by exposing a part of the source contact line 30C. With this configuration, the source regions 27 formed in the second area 13 are connected with the source electrode pad 14.

Note that land portions 31d shown in FIG. 3 form a part of electrical connection paths between the drain regions 24 (28) and drain connection line 30. The land portions 31d are electrically separated from the source connection lines 31.

Moreover, as shown in FIG. 3, the source electrode pad 14 is formed as a two-layer structure. More specifically, as for the I/O circuit 3z, the source contact line 30C formed in the third wiring layer L3 (line to be bonded) is overlapped with the source connection line 31 (line provided therebelow) formed in the second wiring layer L2 in the area where the source electrode pad 14 is to be formed. In other words, the source connection line 31 is provided across the area corresponding to the area where the source electrode pad 14 is formed. The source electrode pad 14 is formed by exposing a part of the source contact line 30C. Accordingly, the source electrode pad 14 is formed as an electrode pad having a two-layer structure where the source contact line 30C and source connection line 31 being overlapped.

By forming the source electrode pad 14 as a two-layer structure, when the wire is bonded with the source electrode pad 14, the physical stress applied to the I/O circuit 3z can be reduced. Moreover, it is not necessary to increase the number of wiring layers in order to achieve the source electrode pad 14 having a two-layer structure by using the source connection line 31 formed in the second wiring layer and source contact line 30C formed in the third wiring layer as a wiring layer for the two-layer structure.

As described above, the source electrode pad 14 is formed by removing a part of the insulating layer deposited to the third wiring layer L3 and exposing the source contact line 30C. This eliminates the need to separately provide the configuration for taking out an electrode from the third wiring layer L3.

Note that the source contact line 30C is provided in the same layer as the drain connection line 30. Therefore, the drain connection line 30 and source contact line 30C may be formed by the same photomask. Thus by forming the source electrode pad 14 having a two-layer structure, it is not necessary to add another process.

Figure 10:
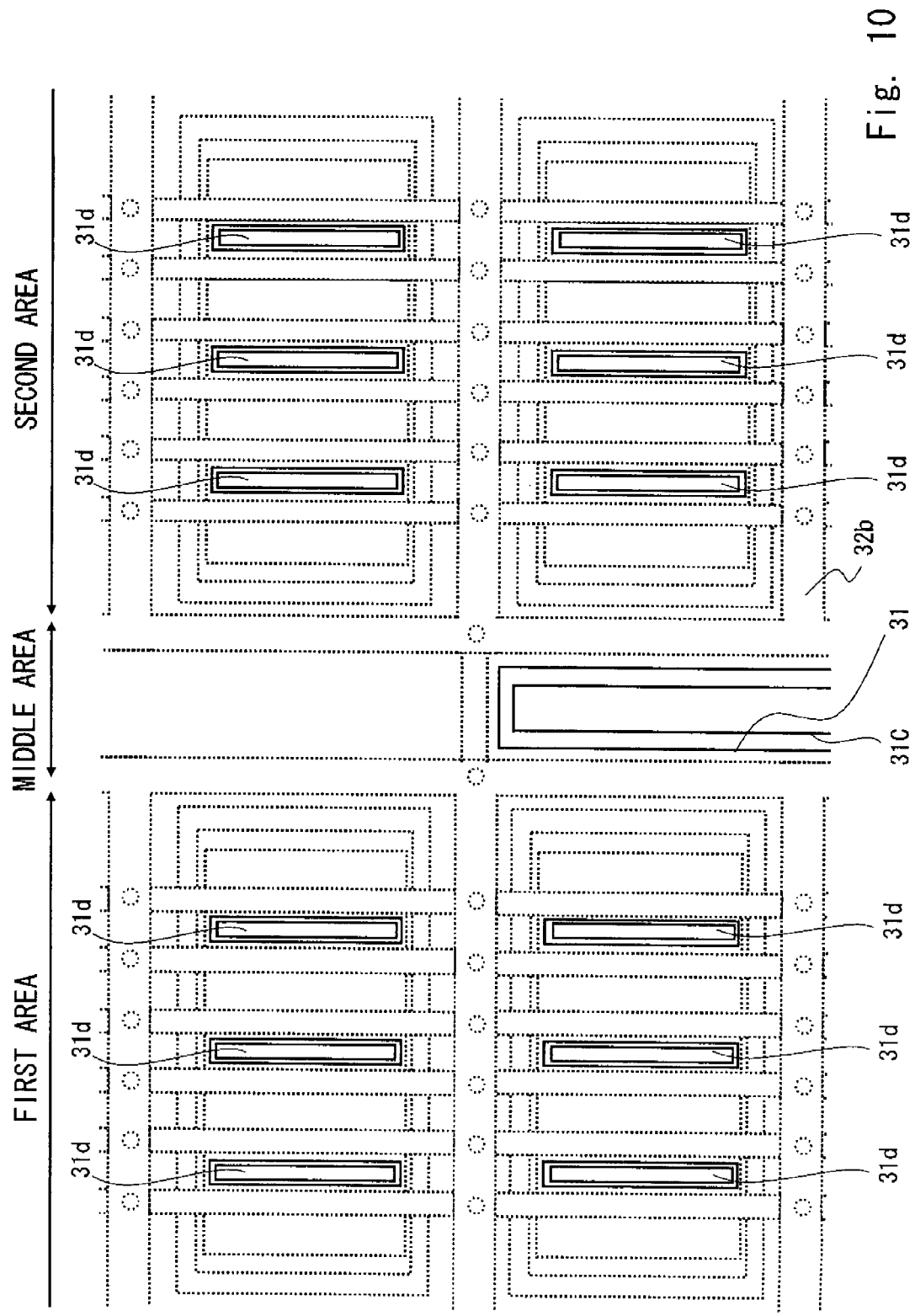
FIG. 10 is a schematic view explaining the planar configuration of a source connection line 31 and a drain contact line 31C.

FIG. 10 shows the planar configuration of the source connection line 31.

As shown in FIG. 10, the source connection line 31 is formed over the first area 12 and second area 13. Furthermore, the source connection line 31 is also formed over a part of the middle area. The source connection line 31 includes a plurality of the land portions 31d in the first area 12 and second area 13. The land portions 31d are formed corresponding to the drain regions 24 (25) formed to the principal surface of the semiconductor substrate SUB and are electrically insulated from the body of the source connection line 31 (portion except the land portions 31d).

That is, the source connection line 31 short-circuits the plurality of source regions 23 formed in the first area 12 with the plurality of source regions 27 formed in the second area 13. Furthermore, the source connection line 31 includes the land portions 31d and insulated from electrical paths among the plurality of drain regions 24 formed in the first area 12 and the plurality of drain regions 28 formed in the second area 13 and the drain connection line 30.

Next, a connection relationship between the gate lines formed separately in the first area 12 and second area 13 is described hereinafter in detail with reference to FIG. 4. As shown in FIG. 4, the gate lines 21 (first gate line) in the first area 12 and gate lines 25 (second gate line) formed in the second area 13 are connected with each other via gate connection lines 32a and 32b provided in the first wiring layer L1 and the connection line 11 provided in the gate wiring layer GL.

That is, as shown in FIG. 4, the gate lines 21 are connected with the gate connection line 32a (first gate connection line) via the through-holes TH that are filled with a conductive material. The gate connection line 32a in the first area 12 is connected with the connection line 11 via the through-hole TH that is filled with a conductive material. The connection line 11 is connected with the gate connection line 32b (second gate connection line) via the through-hole TH that is filled with a conductive material. The gate connection line 32b in the second area 13 is connected with the gate lines 25 via the through holes TH that are filled with a conductive material.

Note that the gate connection line 32a and gate connection line 32b are connected with nodes of circuit elements for power supply (not shown) provided around the I/C circuit 3z and a control voltage is applied from the circuit element.

In this embodiment, the connection line 11 for connecting the gate lines 21 with the gate lines 25 is provided in the same layer as the gate lines 21 and gate lines 25. By placing the connection line 11 in this way, a free wiring space can be obtained in the first wiring layer L1 above the gate wiring layer GL. Furthermore, in the free wiring space, a line can be provided for connecting between the functional areas or the functional areas with the I/O circuit for signal in the circuit chip 1.

Figure 8:
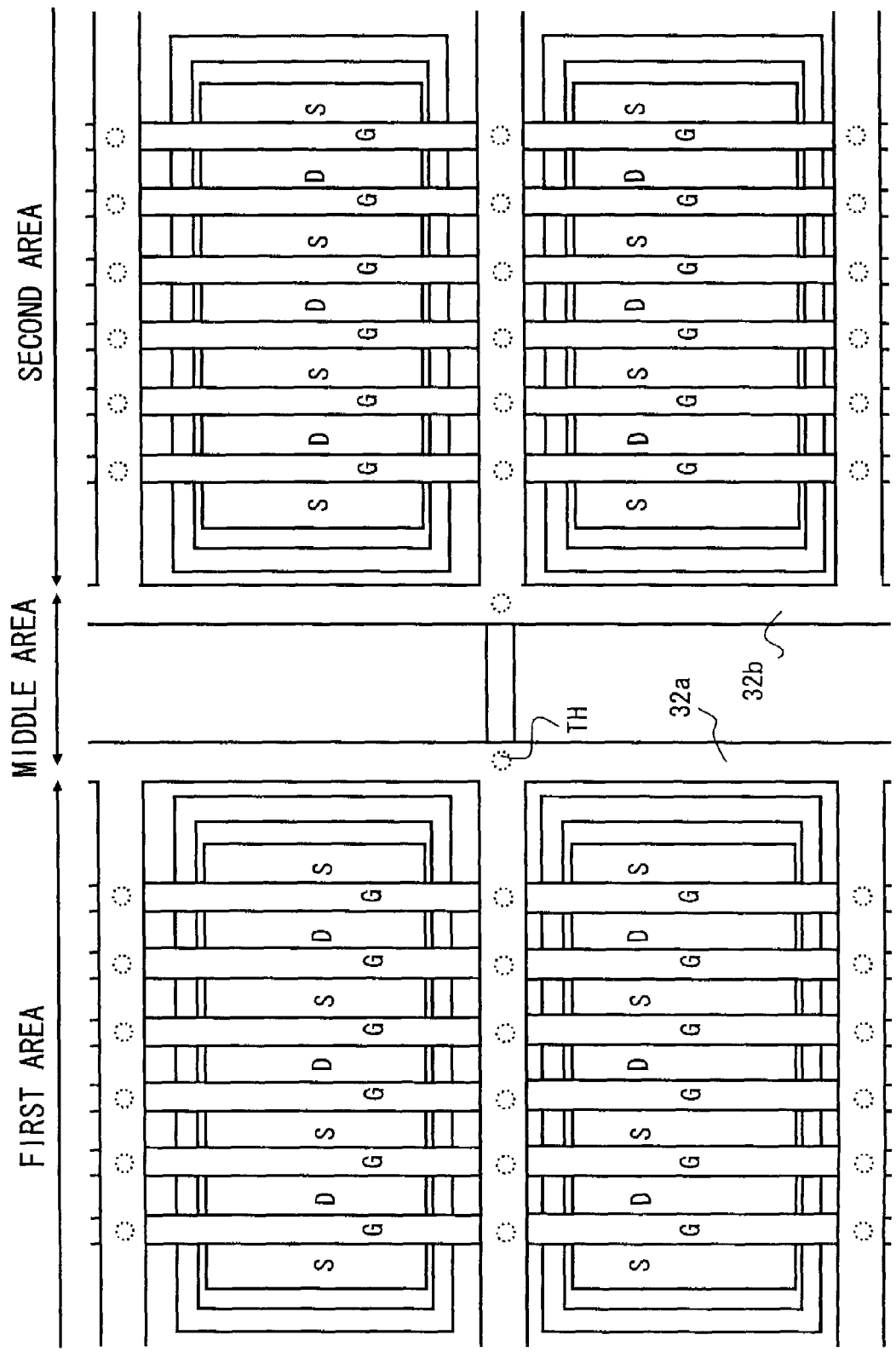
FIG. 8 is a schematic view explaining the planar configuration of the gate connection line 32a (32b)
Figure 9:
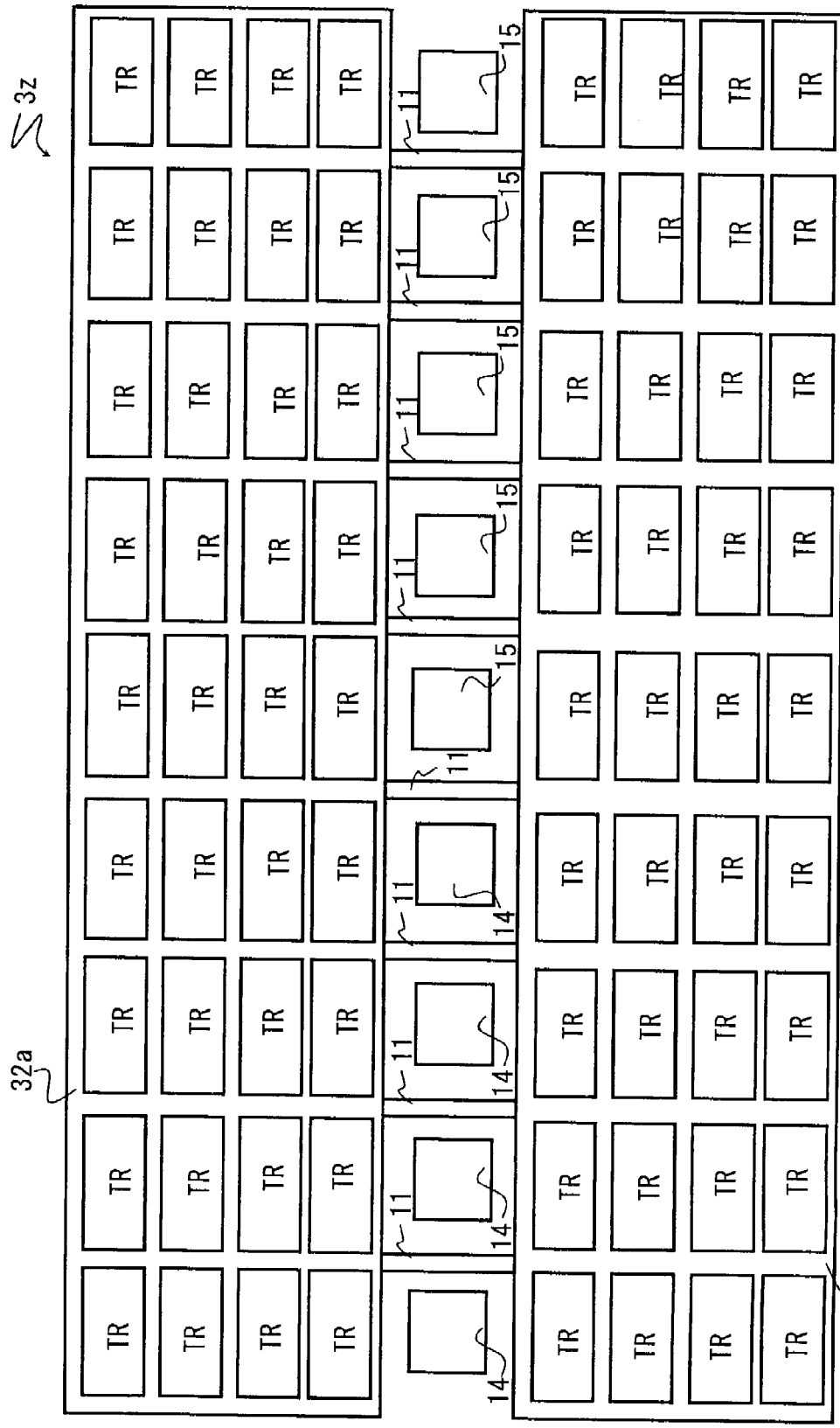
FIG. 9 is another schematic view explaining the planar configuration of the gate connection line 32a (32b)

FIG. 8 is a configuration diagram explaining the planar configuration of the gate connection line 32a (32b). FIG. 9 is a configuration diagram explaining the planar configuration of the gate connection line 32a (32b) As with FIG. 2, FIG. 9 is a configuration diagram of the entire I/O circuit 3z.

As shown in FIG. 8, the gate connection line 32a and gate connection line 32b are formed separately. The gate connection line 32a is formed to surround the unit transistor TR. The gate connection line 32a has a hole corresponding to the unit transistor TR. As shown in FIG. 9, the gate connection line 32a is formed in a grid. The explanation for the gate connection line 32a applies to the gate connection line 32b.

Herein after, a path to take an electrode out from the drain regions formed separately in the first area 12 and second area 13 is described hereinafter with reference to FIG. 5. As shown in FIG. 5, the drain regions 24 (first drain region) formed in the first area 12 and drain regions 28 (second drain region) formed in the second area 13 are connected with the common drain electrode pad 15. The drain electrode pad 15 is formed by exposing a part of the drain connection line 30.

As shown in FIG. 5, the drain regions 24 (28) are connected with the drain connection line 30 provided in the third wiring layer L3 via the through-holes TH that are filled with a conductive material. By exposing the part of the drain connection line 30, the drain electrode pad 15 is formed, which is common to the drain regions 24 and drain regions 28.

Electrical connection paths between the drain regions 24 (28) and drain connection line 30 includes the land portion 31d in the second wiring layer L2. The land portion 31d is electrically separated from the source connection line 31.

In this embodiment, the drain electrode pad 15 is also formed having a two-layer structure as shown in FIG. 5. That is, in the I/O circuit 3z, the drain connection line 30 (line to be bonded) and drain contact line 31C (line placed therebelow) are overlapped in the area where the drain electrode pad 15 is to be formed. In other words, the drain contact line 31C is formed across the area corresponding to the area where the drain electrode pad 15 is formed. The drain electrode pad 15 is formed by exposing the part of the drain connector line 30.

Therefore, the drain electrode pad 15 is formed to have a two-layer structure where the drain connection line 30 overlaps with the drain contact line 31C. The benefits obtained from forming the drain electrode pad 15 to have a two-layer structure are equivalent to those from forming the source electrode pad 14 to have a two-layer structure.

The drain connection line 30 is electrically connected with the drain contact line 31C by the through-holes TH that are filled with a conductive material. Therefore, a current can be passed to the I/O circuit 3z suitably.

Note that the drain contact line 31C is provided in the same layer as of the source connection line 31. Therefore, the drain contact line 31C and source connection line 31 may be formed by the same photomask and thus it is not necessary to increase the number of processes in order to form the source electrode pad 14 having a two-layer structure.

As described above, the drain electrode pad 15 is formed by removing the part of the insulating layer deposited at the third wiring layer L3 and exposing the drain connection line 30. This eliminates the need to separately provide the configuration for taking out an electrode in the third wiring layer L3.

Figure 13:
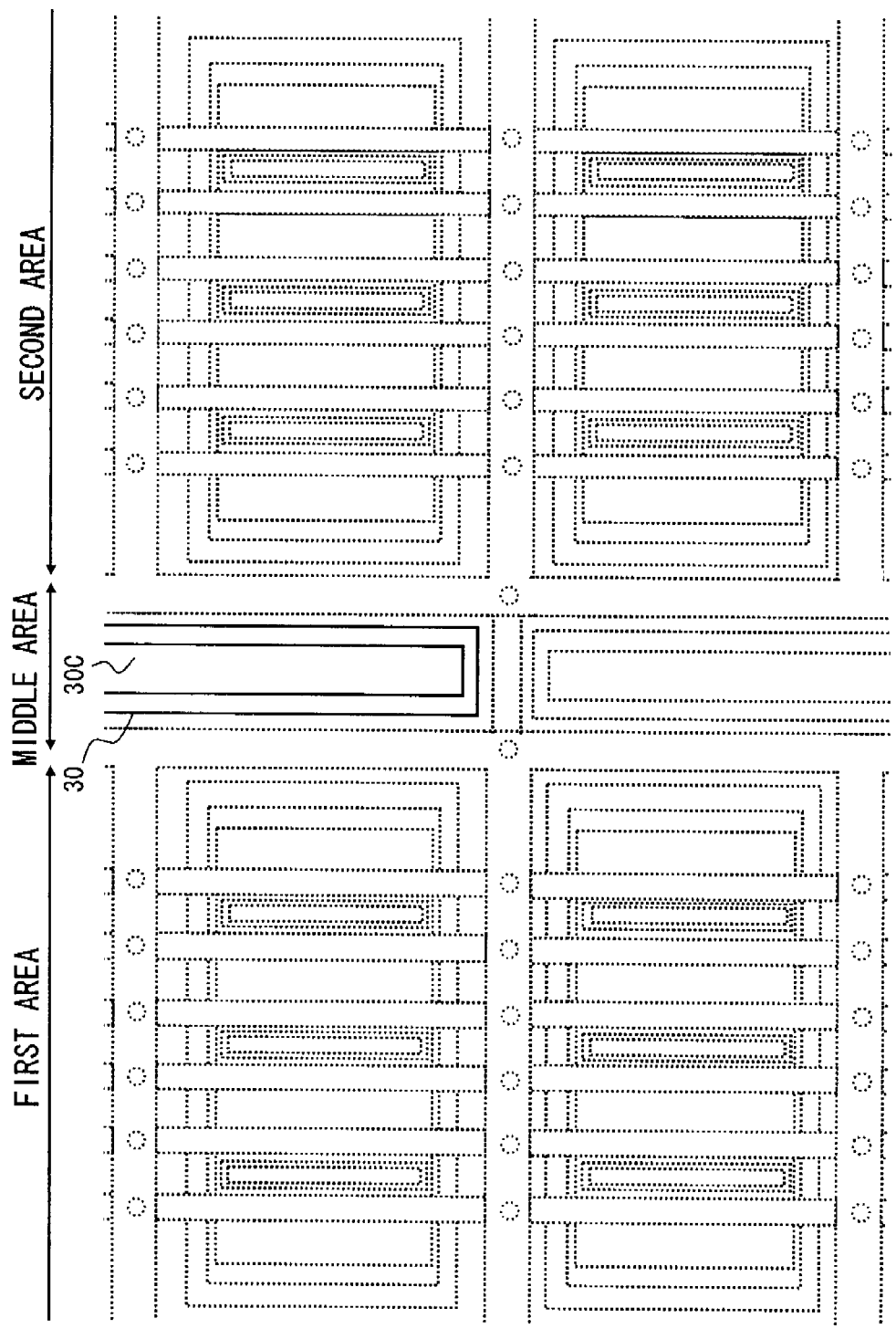
FIG. 13 is a schematic view explaining the planar configuration of a drain connection line 30 and a source contact line 31C.

FIG. 13 explains the planar configuration of the drain connection line 30. As shown in FIG. 13, the drain connection line 30 is formed across the first area 12 and second area 13. Moreover, the drain connection line 30 is also formed partially in the middle area. That is, the drain connection line 30 short-circuits the plurality of drain regions 24 formed in the first area 12 with the plurality of drain regions 28 formed in the second area 13.

Lastly, a manufacturing method of the I/O circuit 3z is described hereinafter in detail with reference to FIGS. 6 to 15.

Firstly, as shown in FIG. 6, a plurality of unit transistors TR are formed in the principal surface of the semiconductor substrate SUB by a usual semiconductor processing technique. More specifically, the source regions 23 and 27 and drain regions 24 and 28 are formed alternatively by a thermal diffusion of impurity. By applying a heat treatment to the semiconductor substrate SUB, the insulating layer 20 such as a silicon oxide film is formed to the principal surface of the semiconductor substrate SUB.

After that, as shown in FIG. 7, the gate lines 21 and 25 and connection line 11 are formed using a usual semiconductor process. Normally, the gate lines 21 and 25 and connection line 11 are formed using the same photomask. In this embodiment, the gate lines 21 and 25 and connection line 11 are formed in the same layer and formed by the same material (for example polysilicon). After forming the gate lines 21 and 25 and connection line 11, an insulating layer is deposited thereover and the gate wiring layer GL is formed.

After that, as shown in FIG. 8, the gate connection lines 32a and 32b are formed using a usual semiconductor process. Normally, the gate connection lines 32a and 32b are formed using the same photomask. The gate connection lines 32a and 32b are formed in the same process and formed by the same material (for example aluminum (Al)).

Note that before forming the gate connection lines 32a and 32b, the plurality of through-holes TH are formed in the gate wiring layer GL and these through-holes TH are filled with a conductive material. The gate connection line 32a is connected with the gate lines 21 and connection line 11 via the prepared through-holes TH. The gate connection line 32b is connected with the gate line 25 and connection line 11 via the abovementioned through-holes TH.

Furthermore, the gate connection lines are formed separately in the first area 12 and second area 13. Therefore, in the first wiring layer L1, the gate connection lines are not formed in the middle area between the first area 12 and second area 13. Therefore, in this space, lines can be provided for connecting between the functional areas or the functional area with the I/O circuit for signal in the circuit chip 1. This increases the degree of freedom for line layout in the circuit chip 1.

Moreover, as shown in FIG. 9, in the first area 12 and second area 13, the gate connection line 32a and gate connection line 32b are formed in a grid. In other words, in each of the areas, the gate connection line is formed to surround each unit transistor TR. By forming the gate connection lines 32a and 32b in this way, it is possible to apply a gate voltage evenly to the plurality of unit transistors TR. Note that by depositing the insulating layer over the gate connection lines 32a and 32b, the first wiring layer L1 is formed.

After that, as shown in FIG. 10, the source connection line 31 and drain contact line 31C are formed using a normal semiconductor process. Normally, the source connection line 31 and drain contact line 31C are formed using the same photomask. The source connection line 31 and drain contact line 31C are formed in the same process and formed by the same material (for example aluminum (Al)). Note that the source connection line 31 is formed to include the land portions 31d. The land portions 31d realizes the electrical connection paths between the drain regions 24 and 28 and drain connection line 30.

Furthermore, before forming the source connection line 31, the through-holes TH are formed in the insulating layer 20, gate wiring layer GL and first wiring layer L1 and the through-holes TH are filled with a conductive material.

The source connection line 31 is electrically connected with the source regions 23 and 27 via the prepared through-holes TH (see FIG. 3). The land portions 31d are connected with the drain regions 24 (28) via the abovementioned through-holes TH (see FIG. 5). By depositing the insulating layer over the source connection line 31 and drain contact line 31C, the second wiring layer L2 is formed.

Figure 11:
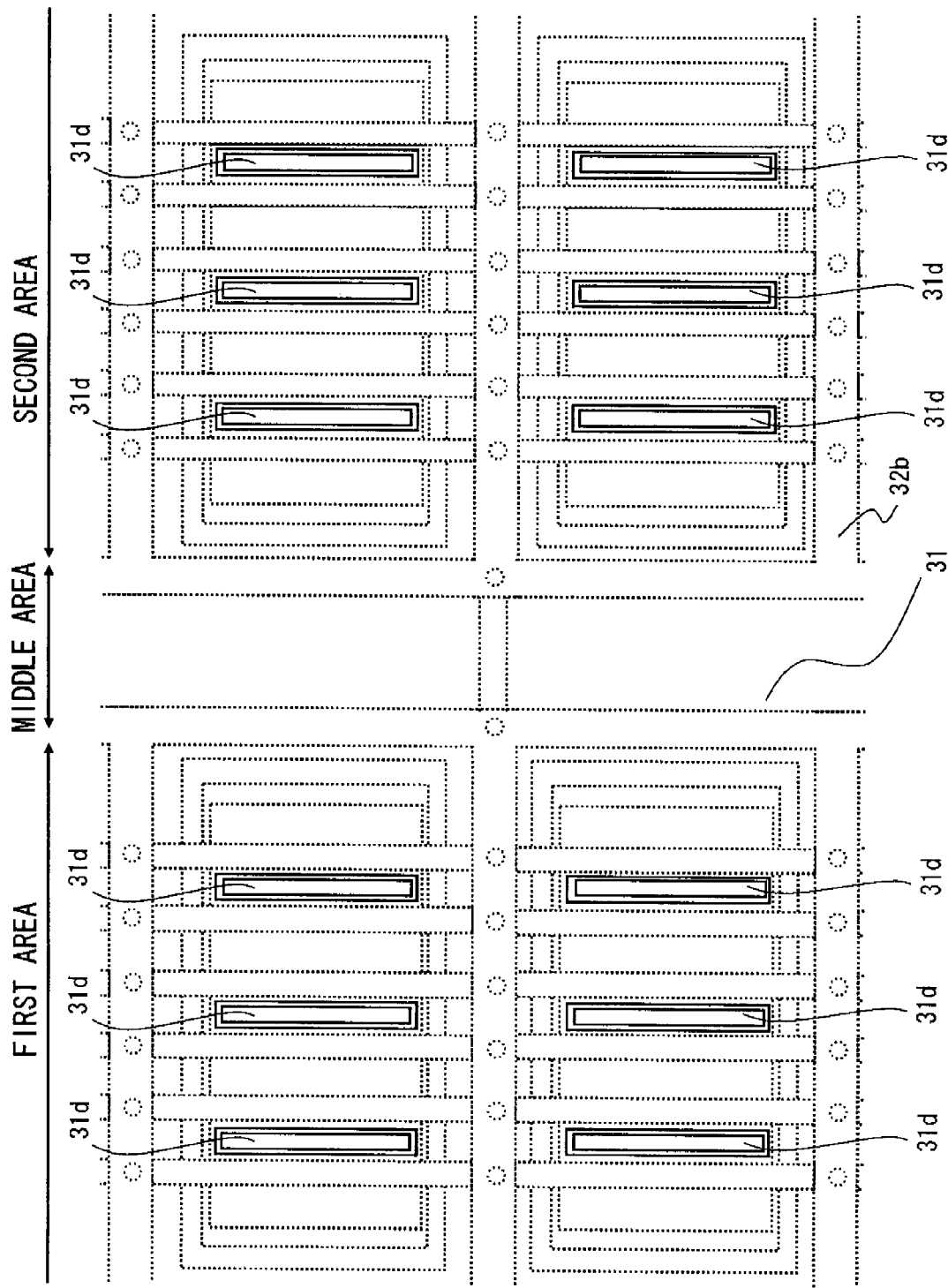
FIG. 11 is a schematic view explaining the planar configuration of the source connection line 31 in a specific area AREA2.
Figure 12:
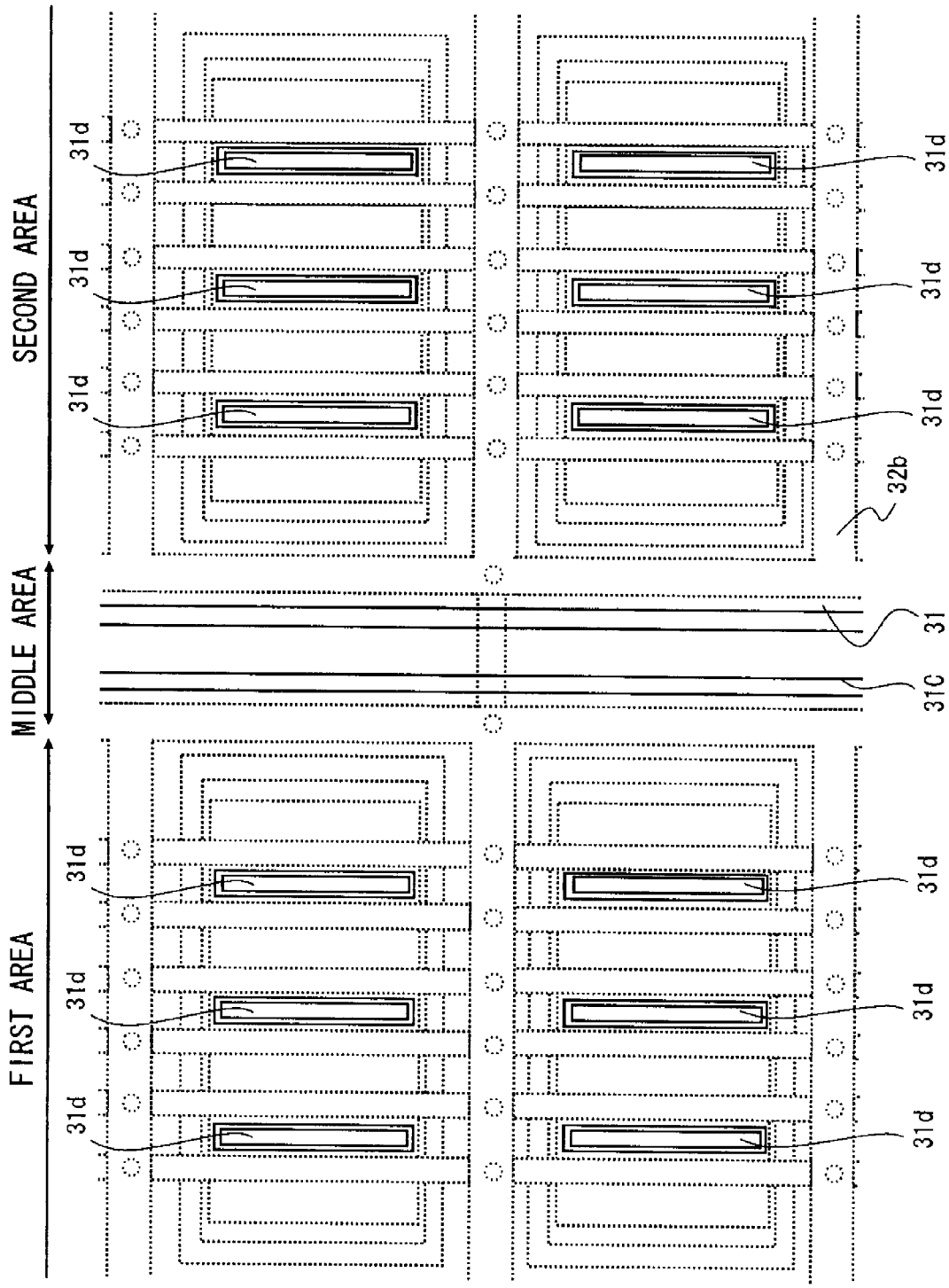
FIG. 12 is a schematic view explaining the planar configuration of the source connection line 31 and a drain contact line 31C in a specific area AREA3.

FIG. 11 shows the planar configuration of the source connection line 31 in the specific area AREA2 of FIG. 2. FIG. 12 shows the planar configuration of the source connection line 31 and drain contact line 31C in the specific area APEA3 of FIG. 2.

As shown in FIG. 11, the source connection line 31 is formed all over the first area 12, middle area and second area 3 having the land portions 31d.

As shown in FIG. 12, the source connection line 31 is formed all over the first area 12 and second area 13 having the land portions 31d. Moreover, the drain contact line 31C is formed across the middle area. This drain contact line 31C is separated from the source connection line 31 as shown in FIG. 12.

In this embodiment, with respect to the line 4B-4B (connection line 11) of FIG. 2, on the left side viewed from front, the source electrode pads 14 are formed and on the right side viewed from front, the drain electrode pads 15 are formed. By placing the electrode pads in this way, it is possible to simplify bonding processes and also simplify the configuration in the middle area of the wiring pattern included in the second wiring layer L2 as shown in FIGS. 10 to 12.

After that, as shown in FIG. 13, the drain connection line 30 and source contact line 30C are formed using a normal semiconductor process. Normally, the drain connection line 30 and source contact line 30C are formed using the same photomask. The drain connection line 30 and source contact line 30C are formed in the same process and formed by the same material (for example aluminum (Al)).

Note that before forming the drain connection line 30, the through-holes TH are formed in the second wiring layer L2 and the through-holes TH are filled with a conductive material.

The drain connection line 30 is electrically connected with the land portions 31d via the abovementioned through-holes TH (see FIG. 5). The drain connection line 30 is electrically connected with the drain contact line 31C via the abovementioned through-holes TH (see FIG. 5). The source contact line 30C is electrically connected with the source connection line 31 via the abovementioned through-holes TH (see FIG. 3).

Figure 14:
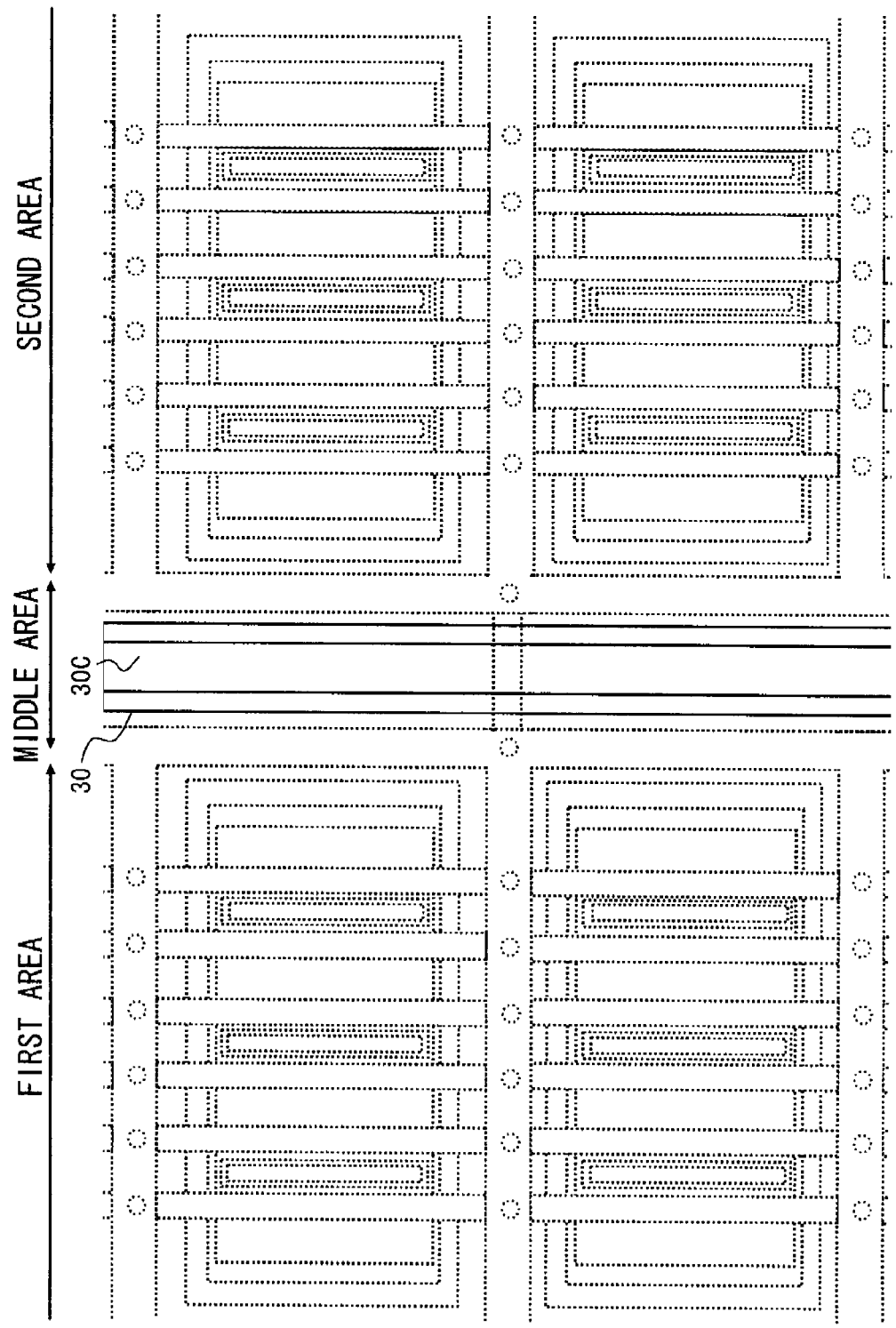
FIG. 14 is a schematic view explaining the planar configuration of the drain connection line 30 and the source contact line 30C in the specific area AREA2.
Figure 15:
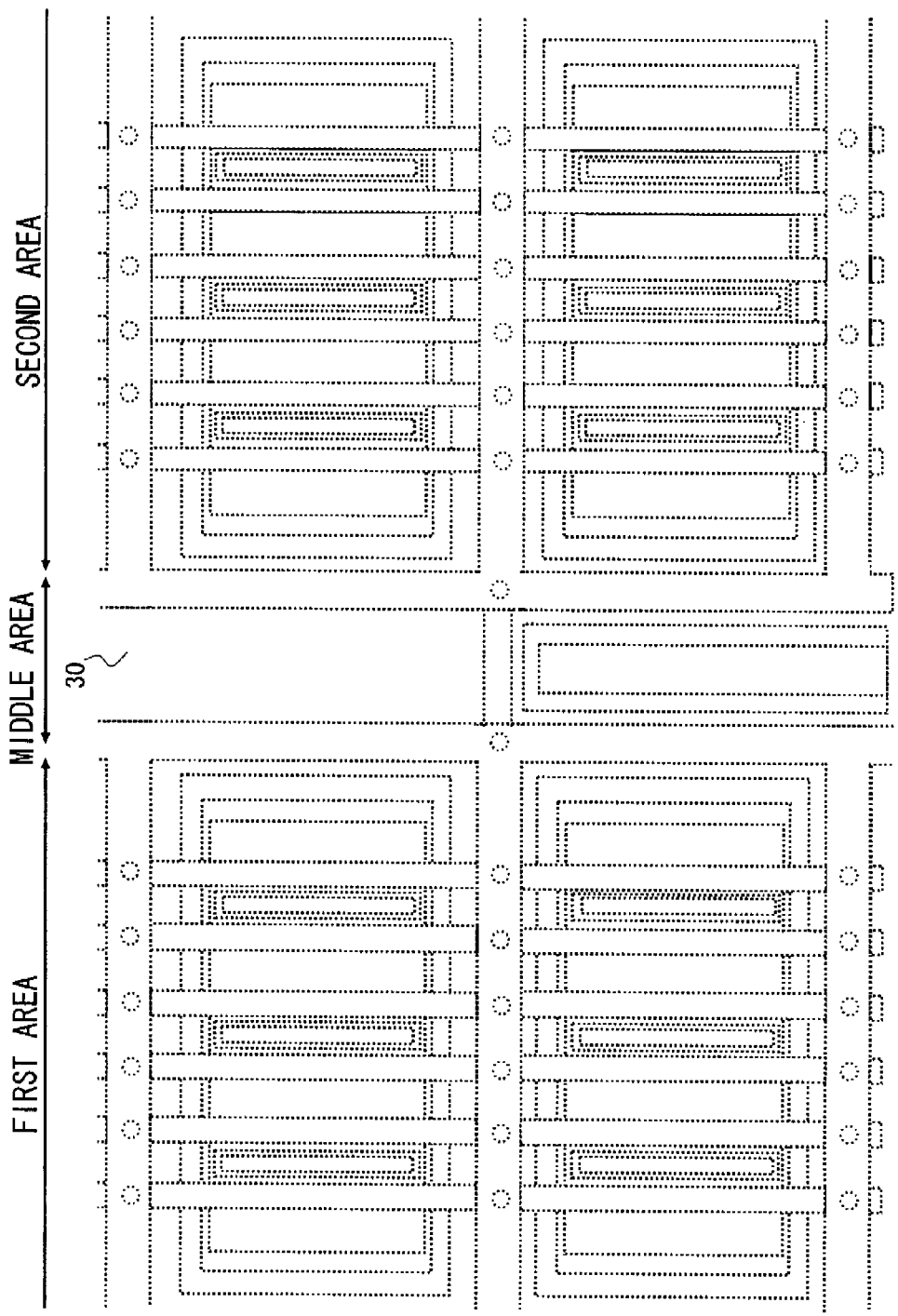
FIG. 15 is a schematic view explaining the planar configuration of the drain connection line 30 in the specific area AREA3.
Figure 16:
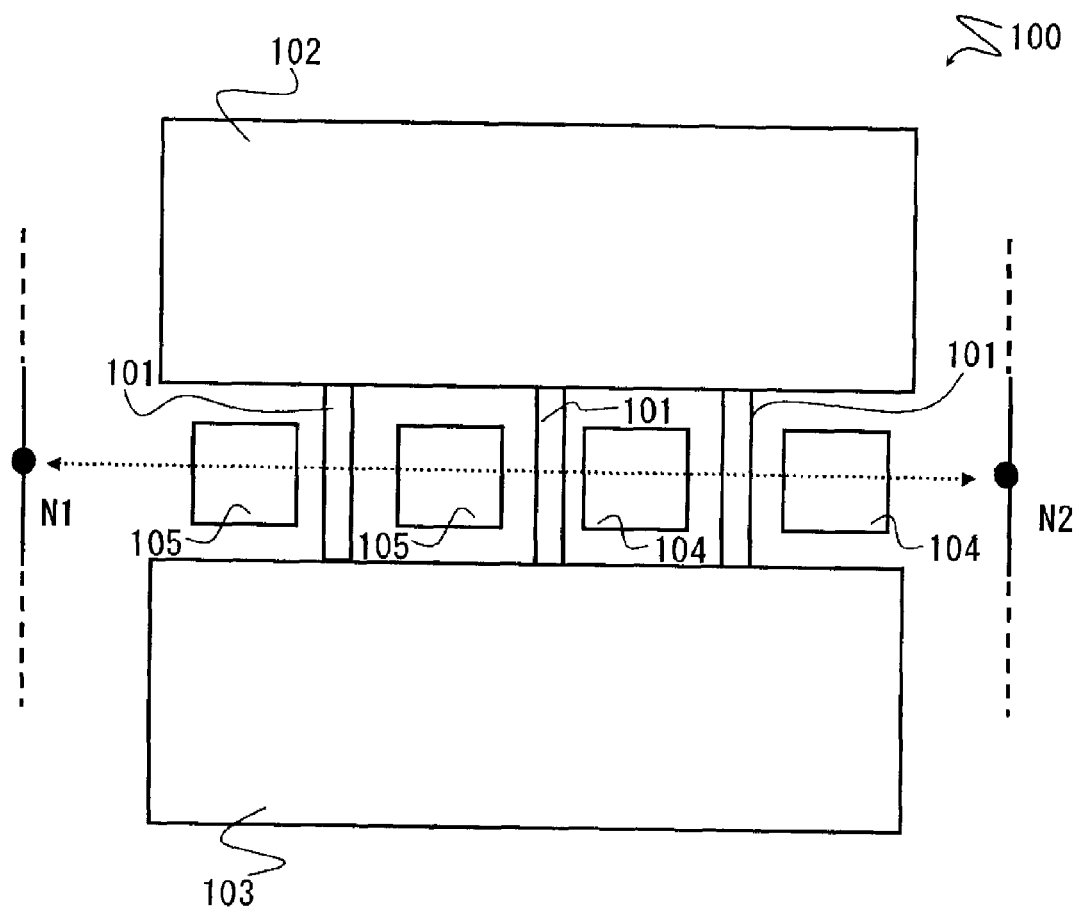
FIG. 16 is a schematic diagram for explaining an I/O circuit 100.

FIG. 14 shows the planar configuration of the drain connection line 30 and source contact line 30C in the specific area AREA2. FIG. 15 shows the planar configuration of the drain connection line 30 in the specific area AREA3.

As shown in FIG. 14, in the specific area AREA2 of FIG. 2, the drain connection line 30 is formed all over the first area 12 and second area 13. Moreover, the source contact line 30C is formed in the middle area.

As shown in FIG. 15, in the specific area AREA3 of FIG. 2, the drain connection line 30 is formed all over the first area 12, middle area and second area 13.

As described above, in this embodiment, with respect to the line 4B-4B (or the predetermined connection line 11) of FIG. 2, on the left side viewed from front, the source electrode pads 14 are provided and on the right side viewed from front, the drain electrode pads 15 are provided. By providing the electrode pads in this way, as shown in FIGS. 13 to 15, it is possible to simplify the configuration in the middle area of the wiring pattern included in the third wiring layer L3.

After that, as shown in FIG. 3, a part of the insulating layer in the third wiring layer L3 is removed. Then the part of the source contact line 30C is exposed. The source electrode pad 14 is formed in this way. Furthermore, as shown in FIG. 5, the part of the insulating layer in the third wiring layer L3 is removed. Then the part of the drain connection line 30 is removed. The drain electrode pad 15 is formed in this way. In order to bond based on image recognition technology, as shown in FIG. 2, the plurality of source electrode pads 14 and drain electrode pads 15 are formed.

A technical scope of the present invention is not limited to the above embodiments. More specifically, the source connection line 31 may be replaced with the drain connection line 30 and provided in the third wiring layer L3. The number of wiring layers is not limited. The electrode pads may be multiplayer structure having more than two layers.

It is apparent that the present invention is not limited to the above embodiment but may be modified and changed without departing from the scope and spirit of the invention.

What is claimed is:
1. A semiconductor device comprising:
a semiconductor substrate;
a first unit transistor formed in a first area in planar view of the semiconductor device, the first unit transistor including a first source region and a first drain region in the semiconductor substrate;
a second unit transistor formed in a second area in planar view of the semiconductor device, the second unit transistor including a second source region and a second drain region in the semiconductor substrate;
a first gate line corresponding to the first unit transistor and formed in a gate wiring layer on the semiconductor substrate;
a second gate line corresponding to the second unit transistor and formed in said gate wiring layer;

wherein each of the first gate line and the second gate line have a longitudinal axis extending parallel to each other and contained within the gate wiring layer;

a connection line that connects the first gate line and the second gate line, the connection line having a longitudinal axis extending in a different direction from the longitudinal axis of the first gate line and the second gate line, the connection line being spaced apart the first gate line and the second gate line and contained in said gate wiring layer so that the connection line and the first gate line and the second gate line are disposed in a same plane, and the connection line is formed in a middle area between the first and second areas in planar view of the semiconductor device;

a first gate connection line formed in a first wiring layer above said gate wiring layer and coupled to the first gate line and the connection line via a through hole;

a second gate connection line formed in said first wiring layer above said gate wiring layer and coupled to the second gate line and the connection line via a through hole, wherein the first gate connection line and the second gate connection line are separately and respectively contained within the first wiring layer of the first area and the second area.

2. The semiconductor device according to claim 1, further comprising:

a source electrode pad formed in a layer above said first and second gate connection lines, formed in said middle area, and coupled to the first and second source regions;

a drain electrode pad formed in a layer above said first and second gate connection lines, formed in said middle area, and coupled to the first and second drain regions;

wherein the connection line is provided between the source electrode pad and the drain electrode pad in planar view of the semiconductor device.

3. The semiconductor device according to claim 2, wherein a plurality of the drain electrode pads are provided at one side from the connection line and a plurality of the source electrode pads are provided at another side from the connection line.

4. The semiconductor device according to claim 1, further comprising:

a second wiring layer formed over the first wiring layer;

a third wiring layer formed over the second wiring layer;

a source connection line to connect the first source region and the second source region, the source connection line being provided at one of the second wiring layer or the third wiring layer; and a drain connection line to connect the first drain region and the second drain region, the drain connection line being provided at another of the second wiring layer or the third wiring layer.

5. The semiconductor device according to claim 4, wherein the source electrode pad or the drain electrode pad is formed by exposing a part of the source connection line or the drain connection line provided in the third wiring layer.

6. The semiconductor device according to claim 5, wherein the second wiring layer includes a line provided across an area corresponding to an area where the source electrode pad or the drain electrode pad are to be formed.

7. A semiconductor device according to claim 4, further comprising:

a source contact line provided in the third wiring layer, the source contact line being electrically separated from the first drain region and the second drain region and electrically connected with the source connection line, wherein the drain connection line is provided in the third wiring layer, and the source electrode pad is formed by exposing the source contact line.

8. The semiconductor device according to claim 7, wherein the source contact line is electrically connected with the source connection line via a through-hole filled with a conductive material formed in the second wiring layer.

9. A semiconductor device comprising:

a semiconductor substrate;

a first unit transistor formed in a first area in planar view about the semiconductor device, the first unit transistor including a first source region and a first drain region in the semiconductor substrate;

a second unit transistor formed in a second area in planar view about the semiconductor device, the second unit transistor including a second source region and a second drain region in the semiconductor substrate;

a first gate line corresponding to the first unit transistor and formed in a gate wiring layer on the semiconductor substrate;

a second gate line corresponding to the second unit transistor and formed in said gate wiring layer;

wherein each of the first gate line and the second gate line have a longitudinal axis extending parallel to each other and contained within the gate wiring layer; and a connection line having a longitudinal axis extending in a different direction from the longitudinal axis of the first gate line and the second gate line, the connection line being spaced apart from the first gate line and the second gate line and contained in said gate wiring layer so that the connection line and the first gate line and the second gate line are disposed in a same plane, and the connection line is formed in a middle area between the first and second areas in planar view about the semiconductor device, and coupled to the first gate line and the second gate line.

* * * * *

UNITED STATES PATENT AND TRADEMARK OFFICE
CERTIFICATE OF CORRECTION

PATENT NO. : 9,070,550 B2
APPLICATION NO. : 11/840966
DATED : June 30, 2015
INVENTOR(S) : Daisaku Kobayashi and Takayoshi Fujishiro It is certified that error appears in the above-identified patent and that said Letters Patent is hereby corrected as shown below:

In the specification

Column 1, Line 57: Delete "former" and insert -- formed --

Column 2, Line 64: Delete "31C" and insert -- 30C --

Column 4, Line 19: Delete "TE" and insert -- TR --

Column 4, Line 63: Delete "SiO2" and insert -- $SiO_2$ --

Column 7, Line 67: Delete "connector" and insert -- connection --

Column 9, Line 42: Delete "APEA3" and insert -- AREA2 --

Column 9, Line 46: Delete "3" and insert -- 13 --

Signed and Sealed this
Eighth Day of December, 2015

Michelle K. Lee
*Director of the United States Patent and Trademark Office*